United States Patent [19]

Payne et al.

[11] Patent Number: 5,016,333
[45] Date of Patent: May 21, 1991

[54] METHOD FOR MANUFACTURING PIEZOELECTRIC POLYMER TRANSDUCERS

[75] Inventors: Peter A. Payne; Mark Nicholls, both of Manchester, United Kingdom

[73] Assignee: Cogent Limited, United Kingdom

[21] Appl. No.: 452,202

[22] Filed: Dec. 18, 1989

Related U.S. Application Data

[62] Division of Ser. No. 206,198, Jun. 13, 1988.

[30] Foreign Application Priority Data

Jun. 18, 1987 [GB] United Kingdom ............... 8714259

[51] Int. Cl.$^5$ ............................................. H01L 41/22
[52] U.S. Cl. .............................. 29/25.35; 264/272.15; 264/272.16; 310/327; 310/800
[58] Field of Search ....... 29/25.35; 310/327, 334–337, 310/346, 800; 264/272.15, 272.16

[56] References Cited

U.S. PATENT DOCUMENTS 4,346,505 8/1982 Lemonon et al. ................ 29/25.35
4,384,394 5/1983 Lemonon et al. .
4,549,107 10/1985 Kaneko et al. ................ 310/800 X

FOREIGN PATENT DOCUMENTS 0112562 7/1984 European Pat. Off. .
2044992 10/1980 United Kingdom .
2059151 4/1981 United Kingdom .
2070505 9/1981 United Kingdom .
2070891 9/1981 United Kingdom .
2150252 6/1985 United Kingdom .

OTHER PUBLICATIONS

Low et al. *Ultrasonics*, vol. 22, No. 2, pp. 85–95, (Mar. 1984).

*Primary Examiner*—Carl E. Hall
*Attorney, Agent, or Firm*—Wolf, Greenfield & Sacks

[57] ABSTRACT

A piezoelectric transducer of piezoelectric plastic material comprises a body and activated transducer film formed integrally. Electrodes are formed on opposite sides of the film, and a backing material supports the film on one side. The transducer may be formed by molding, applying the electrodes and activating the film by means of a corona discharge.

11 Claims, 2 Drawing Sheets

METHOD FOR MANUFACTURING PIEZOELECTRIC POLYMER TRANSDUCERS

This application is a division of application Ser. No. 07/206,198, filed June 13, 1988.

FIELD OF THE INVENTION

1. Background of the Invention

The present invention relates to a method of making a piezoelectric polymer transducer, and to the transducers themselves.

2. Description of the Prior Art

In general, the piezolectric properties of a piezoelectric polymer transducer are determined by a relatively thin film of piezoelectric polymer material, having electrodes on opposite surfaces thereof. This piezoelectric film is cast or formed in other ways into shape in its non-polarisable form, heating it to cause a phase change to bring the material into its polarisable form, and then mounting it on a body, which body is of metal or other material. Since the piezoelectric film is delicate, care must be taken when mounting the film onto the body.

SUMMARY OF THE INVENTION

According to the present invention, however, the film and the body of a piezoelectric transducer are integrally formed by moulding the transducer in a mould which has mould parts which, over a particular area, are closely spaced to form the transducer film.

It has been found that moulding techniques enable the film to be made sufficiently thin for transducer purposes. Thus, it is relatively easy to form a film of thickness less than 100 $\mu$m, and indeed it is not difficult to get down to thicknesses around 25 to 40 $\mu$m. Below that, greater care must be taken in the positioning of the mould parts, but it is thought that it might be possible by this method to achieve a film as small as 3 $\mu$m. Such films cannot easily be made by the standard techniques because they would be too delicate for handling when mounting in a separate body.

With the present invention, the film and the body of the transducer are integrally formed of the same material. That material will, of course, be a piezoelectric plastics material. Some piezoelectric plastics materials, such as PVdF will then have to be reheated during a poling process in order to give the piezoelectric effect desired. However, it has been appreciated that other piezoelectric plastics materials will, when formed by moulding in this way, be capable of being poled at room temperature. An example of such a material is a copolymer of vinylidene fluoride and trifluoroethylene. It is also possible to support the film during poling using part of the moulding tool.

Once the piezoelectric film and body have been moulded, it is necessary to form conductive layers on both faces of the film. One difficulty that normally exists in doing this is the problem of deformation of the film during the formation of a conductive layer. However, the present invention permits this problem to be overcome as one mould part may act as a support for the film while the conductive layer is formed on the opposite side of the film. If the first side of the film to be treated in this way is the interior of the transducer, that interior may then be filled with standard backing material which then acts as a support whilst conductive material is formed on the other side of the film. It is also possible to provide metal foils attached to the opposed surfaces of the mould parts, which foils are left in the transducer material after the mould parts have been removed.

In a further development, the mould parts, if made of conductive material, can be used in the polarisation of the piezoelectric film.

BRIEF DESCRIPTION OF THE DRAWINGS

Embodiments of the invention will now be described, by way of example, with reference to the accompanying drawings in which.

DETAILED DESCRIPTION

Figure 1:
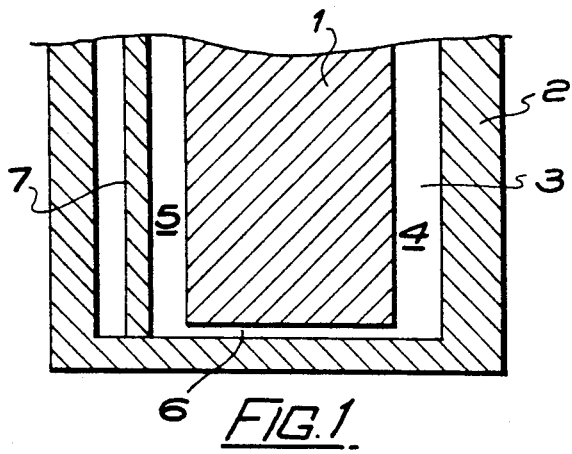
FIG. 1 shows a sectional view of mould parts for forming a piezoelectric transducer according to a first embodiment of the present invention.

Referring first to FIG. 1, a mould for forming a piezoelectric transducer has an inner mould part 1 and an outer mould part 2, positioned so as to define a gap 3 therebetween. The gap 3 has side parts 4,5, which will form the sides of the transducer, and a relatively thin part 6 which will form the thin film of the transducer. A rod-like mould part 7 may be provided extending in one of the side parts 5 of the gap 3, to form a bore through the side wall of the transducer.

Piezoelectric plastics material is then injected or poured into the gap 3 to fill it, and then the material is allowed to solidify. Certain piezoelectric plastics materials such as PVdF must then be heated during poling to cause a phase transition to change the material into its active form. However, some materials such as copolymers of vinylidene fluoride and trifluoroethylene undergo that phase transition due to the heating of the material to enable it to flow to fill the gap 3, and thereafter the resultant material may be poled at room temperature.

Figure 2:
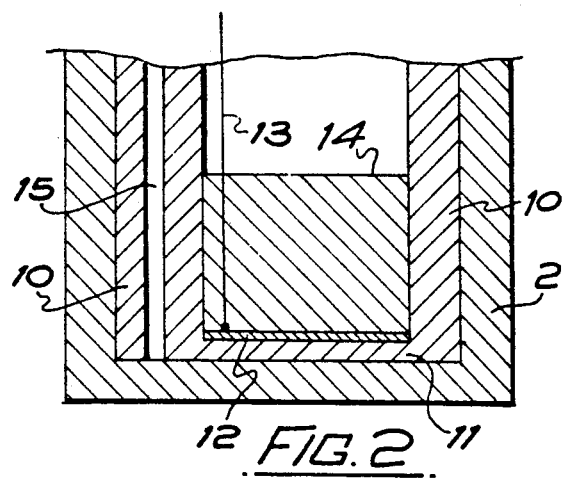
FIG. 2 shows an intermediate stage in the formation of a piezoelectric transducer according to the first embodiment.
Figure 3:
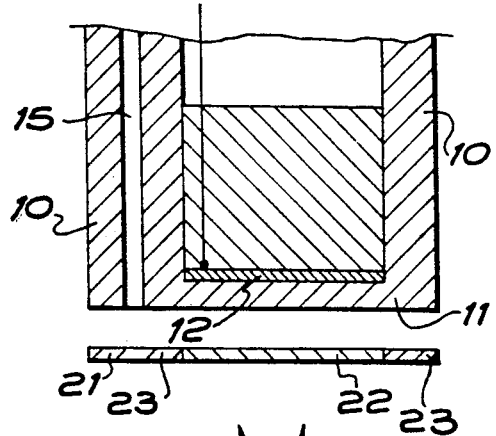
FIG. 3 shows a further intermediate stage, subsequent to that of FIG. 2.

Once the plastics material of the transducer has solidified to form side walls 10 and film 11 shown in FIG. 2, the inner mould part 1 may be removed and a conductive layer 12, e.g. of metal may be formed on the inner surface of the film 11. A conductive connection 13 is then provided to that layer 12, and the interior of the transducer filled with backing material 14. The outer mould part 2 forms a support for the film 11 during the formation of film 12, and backing material 14. As can be seen, the removal of mould part 7 forms a bore 15 in the side wall of the transducer.

It is convenient if the piezoelectric film of the transducer is then polarised. This is done by removing the outer mould part 2, and subjecting the film 11 to Corona discharge. Ions of oxygen are discharged from a Corona source 20 and pass through a mask 21 onto the film 11. As shown, the mask has a central gauze part 22 through which the ions pass to the film 11 and solid side parts 23 which prevent the ions being injected into the side walls 10 of the transducer. In this arrangement the conductive layer 12 may be used as the conductor for generating the polarising current. Typically, this current is 40 μa which is sufficiently small that the thin film of conductive material 12 will not be damaged. Other methods of polarising the film are possible and may be employed.

Figure 4:
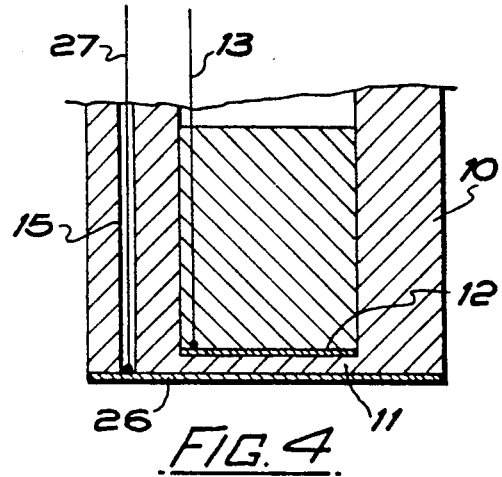
FIG. 4 shows the piezoelectric transducer of the first embodiment.

The resulting transducer is shown in FIG. 4. Once the piezoelectric material of the film 11 has been polarised, a conductive layer 26 is formed on its outer surface, and connected to a conductive lead 27 which may, for example, pass through the bore 15. The conductive layer on the outer surface may be formed in any known pattern including those suitable for Axicon, linear and phased array patterns.

Figure 5:
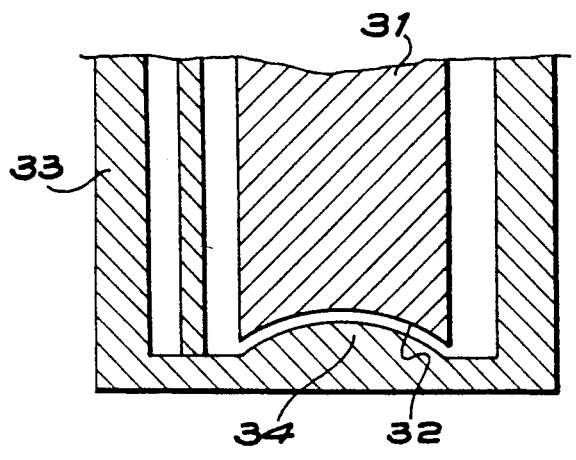
FIG. 5 shows a cross-sectional view through mould parts for forming a piezoelectric transducer according to a second embodiment of the present invention.
Figure 6:
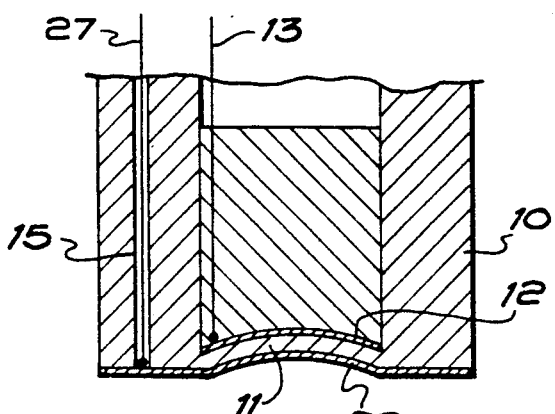
FIG. 6 shows the piezoelectric transducer of the second embodiment.

With the prior art systems of forming the piezoelectric film separately from its supporting body, it is very difficult to form a curved film, to give a focusing effect when the transducer is used as a transmitter or receiver. With the present invention, however, the fact that the mould parts may support the film during poling and metalisation makes it much easier to form a curved film. This is shown in FIG. 5 in which the inner mould part 31 has a concave lower surface 32, and the outer mould part 33 has a convex projection 34 which, when the mould is assembled, lies adjacent the concave surface 32, but spaced from it by the thickness of the film. Once the gap between the mould parts 31,33 has been filled with piezoelectric plastics material, the inner mould part 31 can be removed and the outer mould part acts as a support for the curved film whilst a conductive layer is formed on its inner surface, and the interior of the transducer filled with backing material. The backing material then acts as a support whilst the conductive layer is formed on the other surface of the film. Thus, the present invention makes it simple to form transducers with curved films, such curves being of any desired geometry. An example of such a transducer is shown in FIG. 6. Parts of that transducer corresponding to those of FIG. 4 have the same reference numerals.

Figure 7:
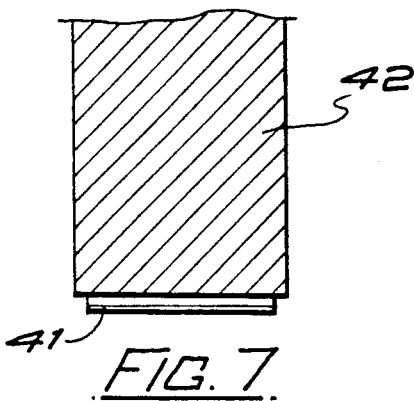
FIG. 7 shows one mould part for use in a third embodiment of the present invention.

As described above, the transducer electrodes are formed on opposite sides of the thin film by forming conductive layers. This is not essential, and FIG. 7 illustrates an alternative method in which a conductive foil 41 releasable supported on the surface of the inner mould part 42 which surface will be that where the thin film is formed. When the piezoelectric plastics material fills a mould containing the mould part 42, the film 41 will be embedded in the plastics material, and when the mould part 42 is removed, the metal layer will remain, thereby forming a conductive electrode. This technique may also be applied to the outer mould part, to form the opposite electrode.

It should be noted that the piezoelectric materials normally have "non-stick" properties, and therefore release easily from the mould parts.

One possible disadvantage of the mould arrangements shown in FIGS. 1 and 5 is that a partial vacuum may develop between the inner mould part 1 and the film 11 when the inner mould part 1 is withdrawn. This could damage the film 11. Therefore, it is presently preferred to use the mould structure shown in FIG. 8.

In that mould structure, there are again outer and inner mould parts 50,51 respectively, which may be positioned to define therebetween a gap 52 in which the transducer film will be formed, and spaces 53,54 in which the transducer body will be formed.

It can be seen, however, that the outer mould part 50 comprises a wall 55 and base 56 which are held together by clamping bolts 57. A groove 58 between the wall 36 and base 35 allows for the overflow of plastics material.

The inner mould part 51 is located relative to the outer mould part 50 by guide pins 59. In this embodiment, the inner mould part 51 has a tapered lower end, to define a tapered transition between the body and the film of the finished transducer. There is a bore 60 in the inner mould part 51 extending to the tapered region of the end of the inner mould part. During the formation of the film and body of the transducer in the mould, the bore 60 is filled with a pin 61, held in place by a screw thread 62 at its upper end. It would be possible for the bore to extend directly to the end of the inner mould part where the transducer film will be formed, but then defects in the film could be formed, due to unevenness between the end of the pin 61 and the end of the inner mould part.

The pin 61 is removed once the plastics material has set and before the inner mould 50 is removed so as to provide an air hole in the vicinity of the film and permit air to pass to the space between the film and inner mould part 51 when that part is being removed, thereby to prevent deformation of the film.

Figure 8:
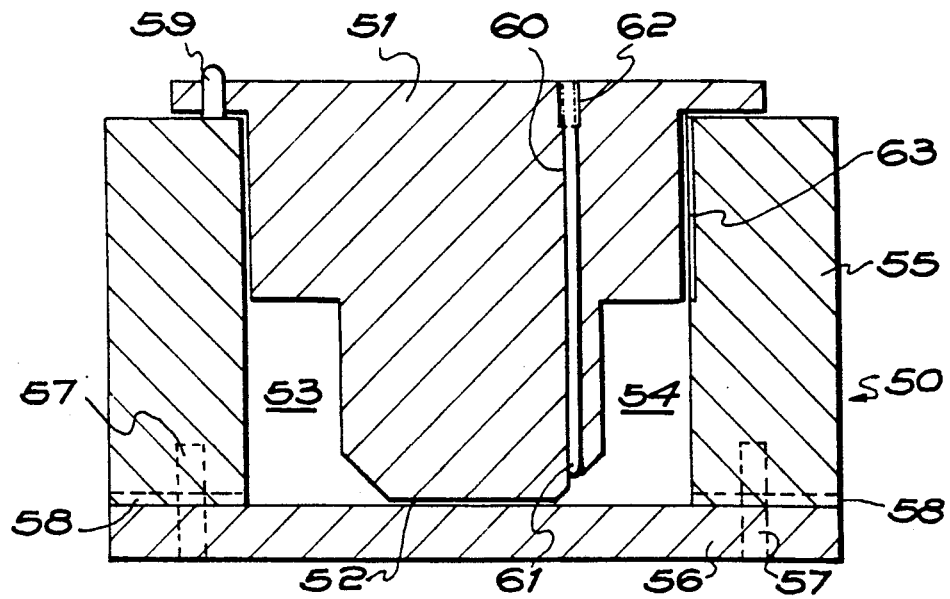
FIG. 8 shows an alternative mould structure.

As shown in FIG. 8, the mould also has a channel 63 between the upper parts of the outer and inner mould parts 50,51 to permit air to escape from the gap 52 and the spaces 53,54, when the mould is being filled.

Thus, the present invention permits the manufacture of a piezoelectric transducer in which the transducer film and the body of the transducer are integrally formed of piezoelectric plastics material. The present invention is applicable to all piezoelectric plastics materials, but finds particular advantage with those materials which are poled at room temperature active after heating to the temperature necessary for them to be moulded.

It would also be possible to provide such a bore in the outer mould part, but the possibility of formation of a partial vacuum on removal of the outer mould part is less of a problem, because the film is then supported by the backing material.

What is claimed is:

1. A method of manufacturing a piezoelectric transducer comprising the steps of:
   forming a transducer assembly in a mold having inner and outer mold parts, the transducer assembly comprising a transducer film and a body integral with the film, the transducer film and body being made of piezoelectric plastic materials;
   removing the inner mold part from the transducer assembly exposing a first opposite side of the transducer film;
   forming a first electrode on the first opposite side, the transducer film being supported by the outer mold part during the step of forming the first electrode;
   placing backing material within the body;
   removing the outer mold part from the transducer assembly to expose a second opposite side of the transducer film;
   forming a second electrode on the second opposite side, the backing material supporting the transducer film during the step of forming the second electrode; and
   activating the piezoelectric film.

2. A method of manufacturing a piezoelectric transducer comprising the steps of:

forming a transducer assembly in a mold having inner and outer mold parts, the transducer assembly comprising a transducer film and a body integral with the film, the transducer film and body being made of piezoelectric plastic materials;

removing the inner mold part from the transducer assembly exposing a first opposite side of the transducer film;

forming a first electrode on the first opposite side, the transducer film being supported by the outer mold part during the step of forming the first electrode;

placing backing material within the body;

removing the outer mold part from the transducer assembly to expose a second opposite side of the transducer film; and forming a second electrode on the second opposite side, the backing material supporting the transducer film during the step of forming the second electrode.

3. A method as claimed in claims 1 or 2 wherein in the step of forming a transducer assembly, the transducer film formed had a thickness of less than about 40 μm.

4. A method as claimed in claim 3 wherein the film has a thickness of less than about 25 μm.

5. A method as claimed in claim 4 wherein the film formed has a thickness of about 3 μm.

6. A method as claimed in claims 1 or 2 wherein in the step of forming a transducer assembly, the film and body are integrally molded of the same piezoelectric plastics material.

7. A method as claimed in claims 1 or 2 wherein in the step of forming a transducer assembly, the piezoelectric plastic materials are selected from the group consisting of polyvinyldifluoride, copolymer of vinylidene fluoride and trifluoroethylene.

8. A method as claimed in claims 1 or 2 wherein the mold parts are used in the activation of the piezoelectric film.

9. A method as claimed in claims 1 or 2 wherein in the step of forming a transducer assembly, the transducer film formed is curved.

10. A method as claimed in claims 1 or 2 wherein at least one of the electrodes is embedded in the transducer film.

11. A method as claimed in claims 1 or 2 wherein both of the electrodes are embedded in the transducer film.

* * * * *